United States Patent
Jensen

(10) Patent No.: US 7,853,029 B2
(45) Date of Patent: Dec. 14, 2010

(54) OUTPUT STAGE FOR A HEARING AID AND METHOD OF DRIVING OUTPUT STAGE

(75) Inventor: Lars Baekgaard Jensen, Vaerlose (DK)

(73) Assignee: Widex A/S, Lynge (DK)

( * ) Notice: Subject to any disclaimer, the term of this patent is extended or adjusted under 35 U.S.C. 154(b) by 1162 days.

(21) Appl. No.: 11/499,769

(22) Filed: Aug. 7, 2006

(65) Prior Publication Data

US 2007/0036375 A1    Feb. 15, 2007

Related U.S. Application Data

(63) Continuation-in-part of application No. PCT/DK2005/000077, filed on Feb. 4, 2005.

(30) Foreign Application Priority Data

Feb. 8, 2004    (DK) ............................... 2004 00188

(51) Int. Cl.
    *H04R 25/00*    (2006.01)
(52) U.S. Cl. ..................... 381/312; 381/317
(58) Field of Classification Search ........ 381/312, 381/316–318, 111, 23.1, 320–321
    See application file for complete search history.

(56) References Cited

U.S. PATENT DOCUMENTS

| | | | | |
|---|---|---|---|---|
| 5,276,910 A | * | 1/1994 | Buchele | 381/79 |
| 6,867,722 B2 | * | 3/2005 | Hochschild | 341/146 |
| 7,336,794 B2 | * | 2/2008 | Furst et al. | 381/117 |
| 2002/0186155 A1 | | 12/2002 | Olson | |

* cited by examiner

*Primary Examiner*—Suhan Ni
(74) *Attorney, Agent, or Firm*—Sughrue Mion, PLLC

(57) ABSTRACT

In an output stage for a hearing aid (62), a reduction in the power consumption for low level input signals is obtained through the use of a time-averaging output driver (42), whereby the output transducer is subject to three different conditions of operations, this being obtained through the generation of three-state control signals for control of a H-bridge. The three-state control signals are generated through the use of a time-averaging device whereby the two-level output of a single bit Sigma-Delta modulator (21) is transformed to a set of control signals that, at any given time, can assume one of three states. In a preferred embodiment the time-averaging device is a delay (40).

10 Claims, 5 Drawing Sheets

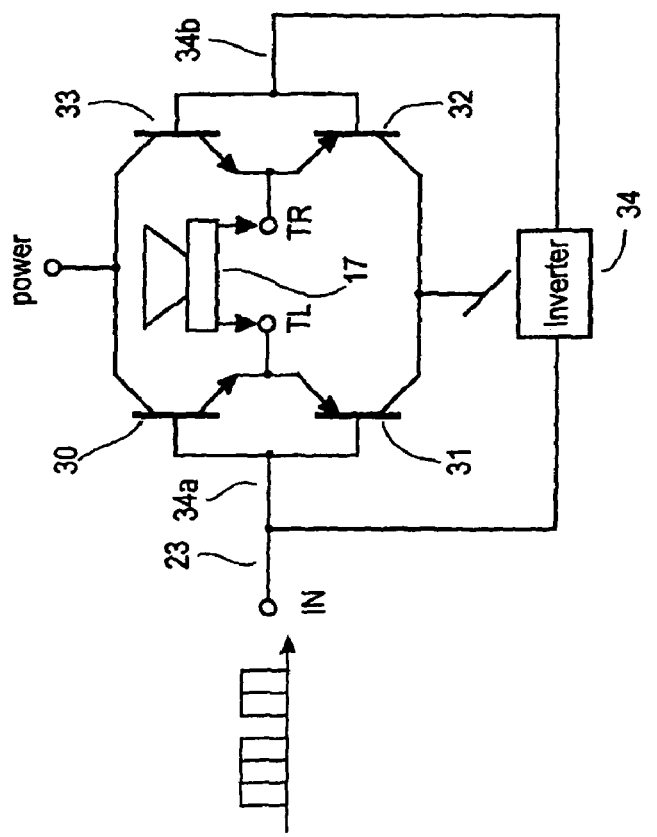
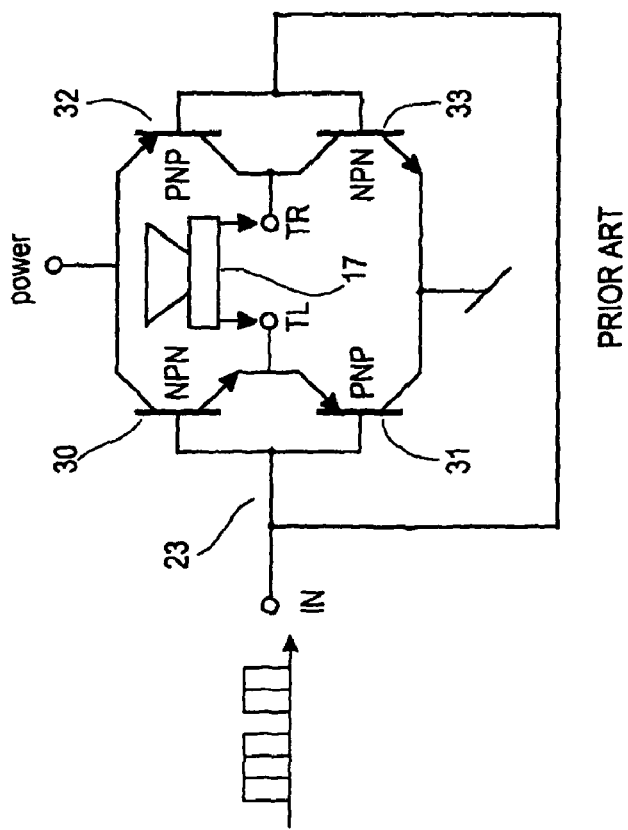
Fig. 3b
Fig. 3a
PRIOR ART

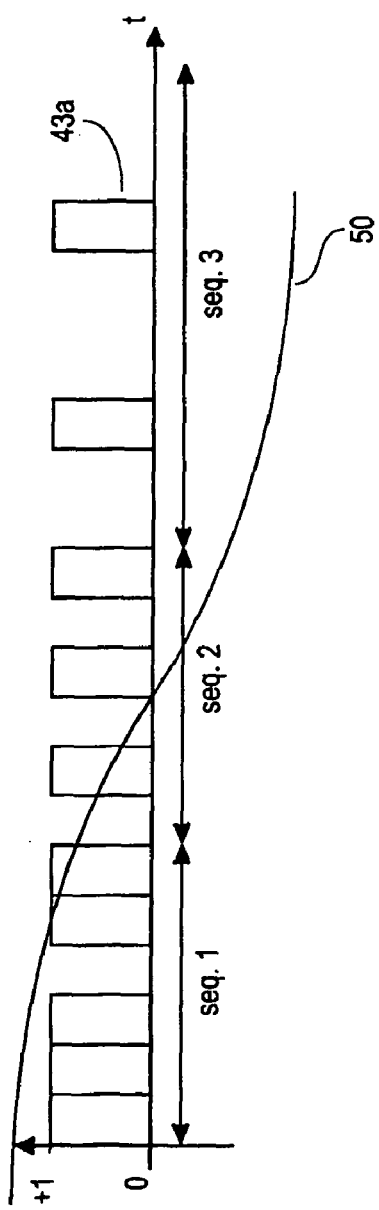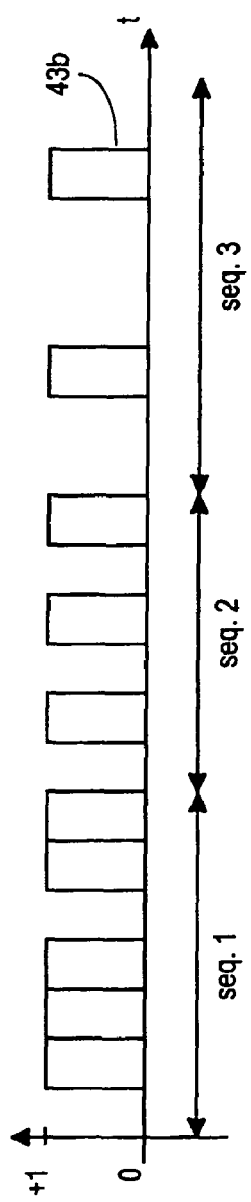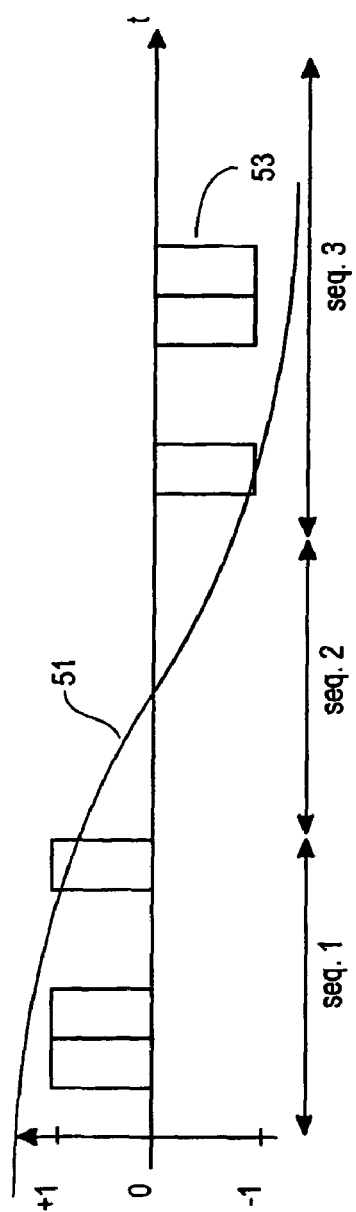

US 7,853,029 B2

OUTPUT STAGE FOR A HEARING AID AND METHOD OF DRIVING OUTPUT STAGE

RELATED APPLICATIONS

The present application is a continuation-in-part of application No. PCT/DK2005/000077; filed on 4 Feb. 2005, in Denmark and published as WO-A1-2005/076664.

The present application is based on and claims priority from PA200400188 filed on 8 Feb. 2004 in Denmark, the contents of which are incorporated hereinto by reference.

BACKGROUND OF THE INVENTION

1. Field of the Invention

The present invention relates to hearing aids. The invention more specifically relates to an output stage for a hearing aid and to a method of driving an output transducer for a hearing aid. The invention, still more specifically, relates to an output stage for driving the output transducer in a hearing aid.

2. The Prior Art

U.S. Pat. No. 5,578,963 discloses an improved class B driver-circuit (a so-called push-pull driver). This is an analog driver that may be used in hearing aids with a digital processor, provided the processor is followed by a DAC (Digital-Analog Converter) for transforming digital signals emanating from the signal processor into analog output signals that control the output driver.

U.S. Pat. No. 5,878,146 relates to a digital hearing aid with a special type of output stage known as a Sigma-Delta converter. In a Sigma-Delta converter a Sigma-Delta modulator is controlled by a digital input and produces a high-speed pulse-modulated binary signal, which is fed to a series-connected low-pass filter, wherein the signal is converted into a low-frequent analog signal. In one embodiment of this converter, the low-pass filtering of the high-bitrate output signal from the Sigma-Delta (S-D) converter is provided by the driver coil in the output transducer, the transducer driver coil performing in this way a dual-function. When the output transducer is relied on for low-pass filtering, the converter may be said to comprise both the modulator, the output driving circuitry and the output transducer. Another way of describing this design would be to say that the output stage is a direct digital output stage, since no DA-conversion, in the ordinary sense, is performed in the hearing aid. In such a device, the DAC is replaced by an S-D modulator, which transforms the digital output from the signal processor into a binary signal suitable for driving the digital (switching) output driver.

U.S. 20020186155 discloses a digital amplifier with a stage for converting an analog input, and with an H-bridge controller, wherein the two halves of the bridges are controlled independently of one another in order to create a three-state condition instead of the conventional two states.

It is a disadvantage with this system that power consumption it relatively high for low amplitude input signals. This is due to the fact that when the high-bit-rate output from a Sigma-Delta modulator is utilized in a push-pull driver, e.g. a FET-based driver, a low-amplitude signal is represented by a binary signal that continually switches between two states at a high rate, causing frequent re-charging of the transistors in the output driver. The high power consumption is a disadvantage due to the reduced battery life-time.

WO03/047309-A1 discloses an S-D DAC. In this prior art system, which is suggested utilized in hearing aids, an S-D modulator, capable of operating with three output states, is utilized. This three-state signal controls a push-pull output driver—a so-called H-bridge, whose output is filtered in a lowpass filter.

Due to a rather complex design, this system is not suitable for use in a hearing aid.

The prior art also has examples on output drivers that utilize more than two states in the driver circuitry. The advantage of this is a reduction in power consumption in the driver stage. It has never been suggested, though, that corresponding three-level control signals can be derived from a simple 1-bit S-D modulator.

SUMMARY OF THE INVENTION

Accordingly, there is a need in the field for a simple output stage with a reduced power consumption.

This need is satisfied, according to the invention in a first aspect, by providing an output stage for a hearing aid, said hearing aid comprising an input transducer device, an AD-converter, a digital signal processor, a single bit Sigma-Delta modulator, an output driver and an output transducer, said output driver having an H-bridge with two branches, each branch having a respective output terminal for connection to the output transducer, a first one of the branches being controlled by a first binary control signal, and a second one of the branches being controlled by a second binary control signal, which second binary control signal is derived as a time-delayed version of the first control signal. In this output stage the high-speed single-bit (i.e. two-state) bitstream from the Sigma-Delta modulator is transformed in the output driver into a time-averaged three-state drive condition that represents the current to be driven through the output transducer.

The invention in a second aspect provides a hearing aid comprising an input transducer device, an AD-converter, a digital signal processor and an output stage, said output stage comprising a single bit Sigma-Delta modulator and an output transducer, said output stage further comprising an output driver, said output driver having an H-bridge with two branches, each branch having a respective output terminal for connection to the output transducer, a first one of the branches being controlled by a first binary control signal, and a second one of the branches being controlled by a second binary control signal, which second binary control signal is derived as a time-delayed version of the first control signal.

The invention, in a third aspect, provides a method of driving an output transducer in a hearing aid, comprising producing a first binary control signal, producing a second binary signal in the form of a delayed version of the first binary control signal, selecting an H-bridge having a first branch and a second branch, connecting a respective output terminal of each of said first and said second branch with a respective terminal of the output transducer, controlling said first branch by the first binary control signal, and controlling said second branch by the second binary control signal.

Further embodiments appear from the dependent claims.

BRIEF DESCRIPTION OF THE DRAWINGS

In the following text, various embodiments of the invention will be disclosed in connection with a description of an embodiment of the invention. This description will refer to the appended figures, where:

FIG. 3a shows the configuration of the prior art output driver of FIG. 2;

FIG. 3b shows the configuration of an output driver according to the invention;

FIG. 5a shows the S-D modulator output;

FIG. 5b shows the S-D modulator output delayed by one clock-pulse; and

FIG. 5c shows the three-state drive conditions of the output driver.

DETAILED DESCRIPTION OF THE INVENTION

Figure 1:
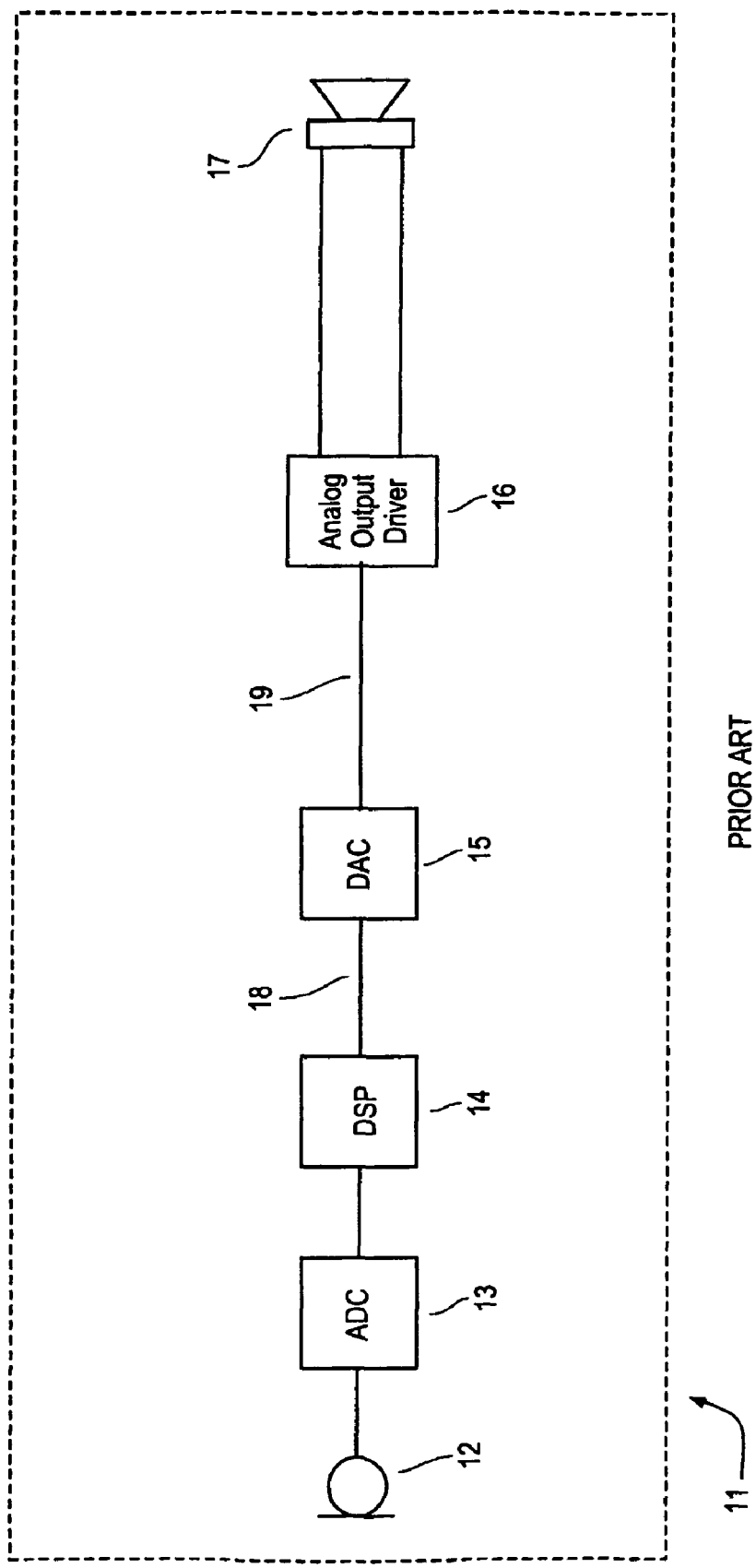
FIG. 1 shows a hearing aid with a DAC and an analog output driver of the prior art.

Reference is first made to FIG. 1, which illustrates a digital hearing aid 11 with an analog output stage. This hearing aid 11 basically comprises a microphone 12, an Analog-Digital Converter 13, a Digital Signal Processor DSP 14, a Digital-Analog Converter DAC 15, an analog output driver 16 and a receiver 17. The components 12, 13 and 14 are standard components within this field of the art. In particular, the microphone 12 could be replaced by a microphone array, possibly including analog means for providing the hearing aid with a directional sound receptive characteristic. Further, the DSP could be of any known construction, in particular, it could be a hard-wired ASIC (application-specific integrated circuit) which is controllable/programmable through the use of a configuration/parameter RAM storage. In the explanation of the invention, it is sufficient to say that the processor outputs either a serial or a parallel series of binary digits suitable for being processed in a DAC 15. Suitable implementations will be evident to the skilled person.

In the DAC 15 the input bitstream 18 is converted to low-pass filtered analog output signals 19 that control the analog output driver 16, which in turn feeds power to the output transducer 17. In the design of FIG. 1 the output driver could be a class B amplifier stage with a voltage gain of one, sometimes referred to as an impedance converter. As an example, U.S. Pat. No. 5,578,963 discloses an improved class B driver-circuit (a so-called push-pull driver).

Figure 2:
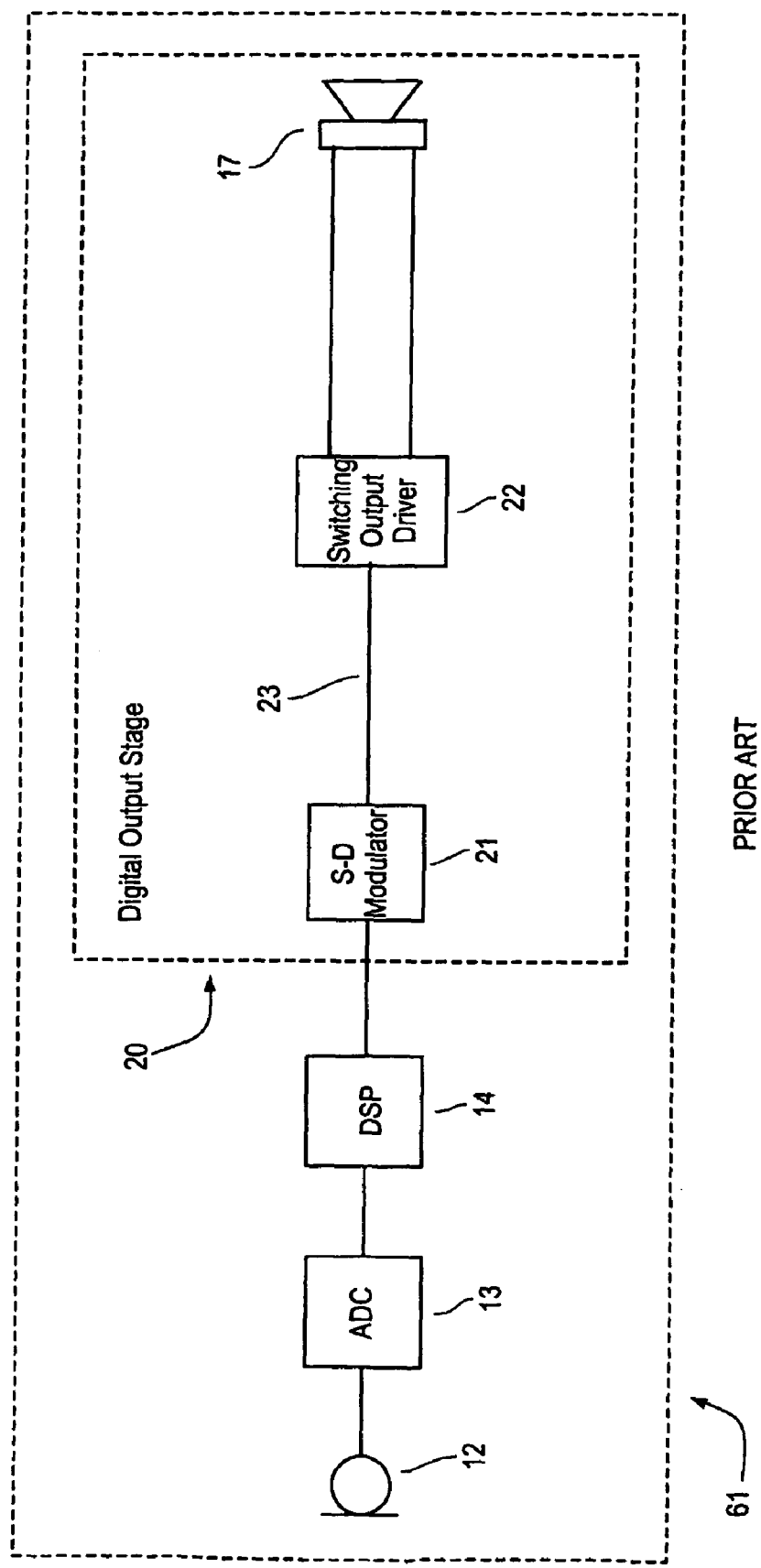
FIG. 2 shows a hearing aid with a digital output stage of the prior art.

FIG. 2 shows a hearing aid with an H-bridge digital output stage according to the prior art. This hearing aid 61 basically comprises components 12, 13, 14 and 17 similar to those described above in connection with the description of FIG. 1. However, in place of the DAC 15 and the output driver 16 as shown in FIG. 1, the device in FIG. 2 employs an H-bridge digital output stage 20. This stage comprises an S-D modulator 21 and a switching output driver 22. The S-D modulator 21 is a first order single-bit S-D modulator that generates a pulse density modulated, single-bit output signal 23. The output driver is a class D driver, also known as a switched H-bridge, controlled by the output 23 of the S-D modulator 21. This driver is shown in detail on FIG. 3a.

FIG. 3a depicts the switching output driver 22, by way of example, as a switched class D stage of bipolar transistors in a bridge configuration with a left and a right branch. The left branch comprises NPN-transistor 30 and PNP-transistor 31 connected in a push-pull arrangement to control the voltage of the left output terminal TL. The right branch comprises PNP-transistor 32 and NPN-transistor 33 connected in a push-pull arrangement to control the voltage of the right output terminal TR. The receiver 17 is connected across the output terminals TL, TR and driven by the voltage differential across the output terminals.

State of the art hearing aid chips are preferably implemented in some kind of FET technology, e.g. a CMOS technology. For this purpose NPN-transistors 30, 33 would be implemented in the form of appropriate, e.g. n-channel FET, devices and the PNP-transistors 31, 32 would be implemented by appropriate, e.g. p-channel FET, devices. A high state of the input 23 will result in a current driven through the transducer 17 in one direction, while a low state of the input 23 will result in a current driven the opposite way. Hence, there is no possible state wherein no current is driven through the transducer 17. Therefore, a low level input signal to the input transducer 12 will need to be represented by a rapidly shifting sequence of bits in the S-D modulator output 23, arranged to provide an average pulse density value close to zero. This is unfortunate in respect of power consumption, since the rapid charging of the input capacitors in FET-devices will lead to considerable power loss. It is evident that also for a bipolar implementation, a sequence of rapid oscillations will lead to enhanced power consumption compared to a zero-state representation of low level signals.

Figure 4:
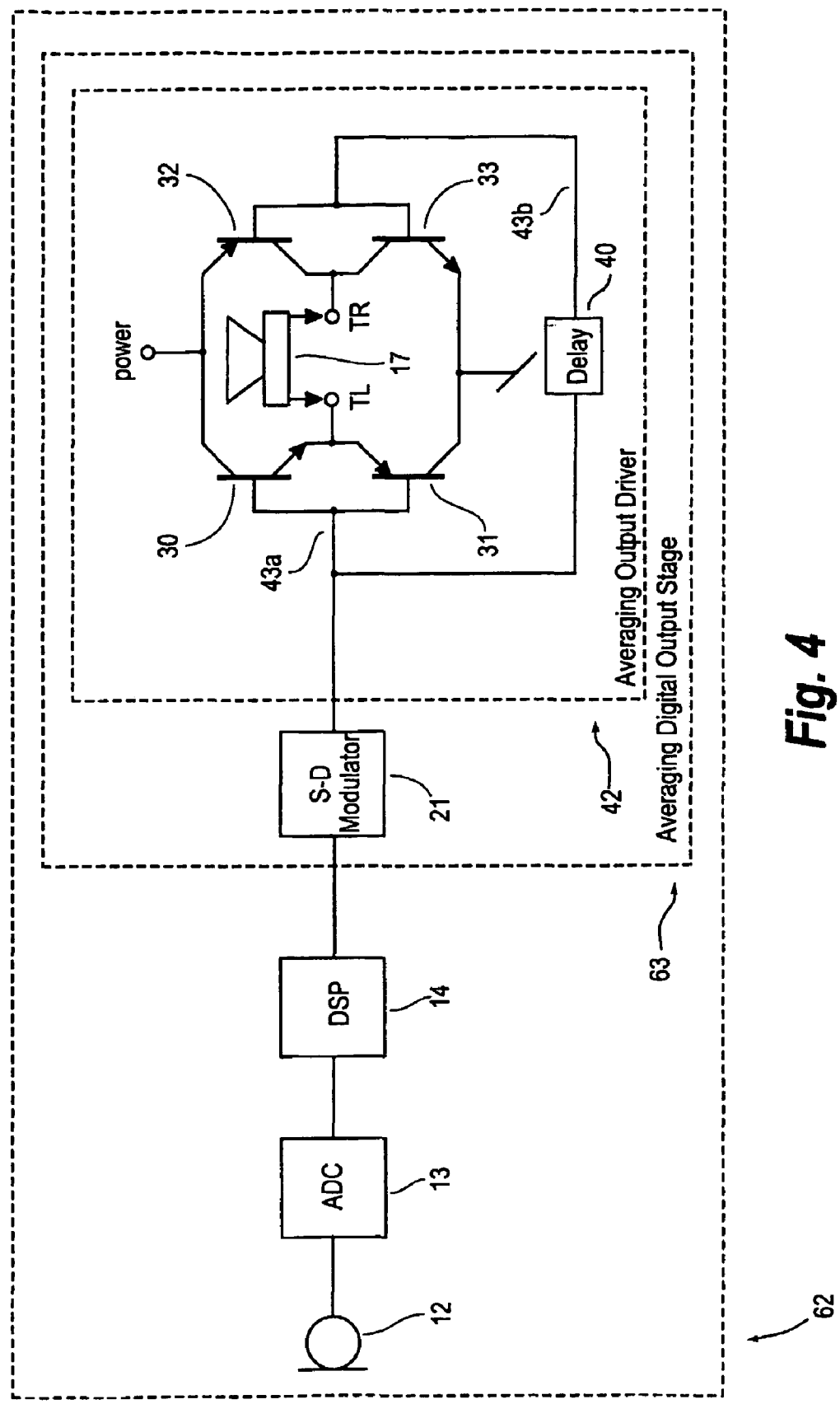
FIG. 4 shows a hearing aid according to the invention.

FIG. 4 shows a hearing aid 62 according to an embodiment of the invention. This hearing aid 62 has components 12, 13 and 14 similar to those described above in connection with the description of FIG. 2 and then, in the place of the digital output stage 20, a time-averaging digital output stage 63 comprising S-D-modulator 21 and averaging output driver 42. The Sigma-Delta modulator 21 is similar to the Sigma-Delta modulator 21 in FIG. 2. The averaging output driver 42 introduces a modified version of the driver shown on FIG. 3a. This time-averaging output driver transforms a two-state output from the S-D modulator 21 into a three-state set of transducer drive conditions. This is obtained by deriving two bit streams from the S-D modulator output 23, one stream 43a, identical to the stream 23, for controlling the left branch 30, 31 of the bridge and another stream 43b, identical to 23 except for being delayed by a clocked delay 40 with one clock pulse, for controlling the right branch 32, 33 of the bridge. The implementation of a suitable clock circuitry will be obvious to the skilled person.

By controlling the transistors of the averaging output driver 42 with these two bit streams, a zero-drive condition of the output transducer 17 is obtained every time the bit stream 23 comprises a transition from one state to the other. The effect of this is illustrated by FIGS. 5a, 5b and 5c; FIG. 5a showing the left bit stream 43a, which is identical to the S-D modulator output bit stream 23; FIG. 5b showing the right bit stream 43b, which is identical to the S-D modulator output delayed by one clock-pulse; and FIG. 5c showing a representation 53 of the drive-state of the output transducer 17 together with the corresponding output transducer current 51, which has been obtained through low-pass filtering the drive-state signal 53.

Accordingly, on FIG. 5c, the curve 53 represents the result of the logical calculation $(B^{-1}-B')(B*B'^{-1})$, where * is the XOR-operator, B is the state of the control signal 43a and B' is the state of the control signal 43b, which actually is a delayed version of the output signal 23.

This calculation deserves some further explanation: the XOR operation between the signals B and B' ensures that each time these signals are different, the operation yields a 1. This result is negated, so that when the states of the two signals is different, a 0 results, while a 1 results when the two states are identical. The term $(B^{-1}-B')$ yields a sign of "+" when B' is 0 and of "−" when B' is 1, such that the result of the calculation falls within the set $\{1, 0, -1\}$, i.e. a three-state set, wherein the "1"-state represents a transducer drive condition with current in one direction when the expression BB' is true, while the "−1"-state represents current in the other direction when the expression $(B)^{-1}(B')^{-1}$ is true and the 0-state represent no current when either the expressions $B(B')^{-1}$ or $(B)^{-1}B'$ is true.

Perhaps this is better explained by studying FIG. 4: a transition in B, 43a, from 1 to 0 will result in a 0-state control signal on both sides of the driver, when account is taken of the inverting character of the H-bridge, i.e. both control signals 43a, 43b will effectively be in the same state; hence each side of the driver will try to oppose the current from the other side, the result being no current. Likewise for a transition from 0 to 1. However, when B and B' are identical, current will flow in the transducer, the direction being determined by whether the value of B is 0 or 1. This can be seen by comparing the FIGS. 5a, 5b and 5c. Since the figures are aligned in time, a time sample with a 1-state on FIG. 5a and a 1-state on FIG. 5b will translate to a 1-state on the curve 53 on FIG. 5c, while a 0-state in both will translate to a −1-state.

The relationship between the control signal 23 and the output transducer current 51 can be summarized in a table as follows:

| Table of output transducer current | State of 23 in previous clock cycle | |
|---|---|---|
| | 1 | 0 |
| State of 23 in current clock cycle | 1 | 1 | 0 |
| | 0 | 0 | −1 |

Thus, by appropriate control of the control signal, the driver is capable of outputting pulses and steady state signals in either direction as well as a zero output.

From the description of the driver stage according to the invention, it is clear that a time-averaging function is obtained, since transitions in the bit stream 23 lead to zero drive-current situations, while a drive-current condition requires two or more consecutive identical bits in order to occur. The averaging output driver according to the invention uses a standard S-D modulator and achieves the desired driving of the output transducer but reduces the effective rate of switching of the driver transistors and thereby does not rely solely on the transducer driver coil for averaging the drive current.

Accordingly, as it further will appear from FIG. 5a, low level input signals, which are represented by a rapid oscillation in the bitstream 23 will be transformed by the output driver into a slow oscillation in the transducer current, whereby power is saved. To comment in detail on FIG. 5a, the input signal is indicated by the curve 50 on FIG. 5a. The representation of this signal in the S-D modulator output bit stream 23, 43a is also shown. For relatively high positive input levels, labelled seq.1, the average pulse density is above 50%, while high negative input levels, labelled seq.3, cause an average pulse density below 50%. A zero, or low, level input, labelled seq.2, causes a pulse density at 50%. On FIG. 5c the corresponding output transducer current is indicated by the curve 51 (assuming that the transducer provides the filtering, and the drive condition state is shown by the curve 53. For positive drive currents, labelled seq.1, the drive condition is in the state+1 for a substantial period of time, while for negative drive currents, labelled seq.3, the drive condition is in the state−1 for a substantial period of time and drive currents close to zero, labelled seq.2, are represented by a drive condition which is in the state 0 for a substantial period of time.

On FIG. 3b the sequence of NPN- and PNP-transistors on the right side of the driver stage 33, 32 has been inverted. The inverted arrangement of the transistors inverts the relationship between the level of the respective control signal 43b and the voltage of the respective output terminal TR. The inverted relationship can be offset to avoid changing the performance by incorporating an inverter 34 in the line of the control signal 34b, provided the delay between the control signals 34a and 34b is substantially zero. This will all be evident to the skilled person.

In an embodiment of the invention, the time-averaging function of the output driver is obtained by use of a clocked inverter, whereby the required delay is obtained through the one clock-pulse delay inherent in the inverter.

In another embodiment of the invention, the time-averaging function of the output driver is obtained by use of a clocked, inverting flip-flop, whereby the required delay is obtained through the one clock-pulse delay inherent in the flip-flop.

It has been mentioned in the discussion above that the time-averaging function can be obtained by either a delay or an inverter-delay combination, in dependency of whether the H-bridge is inverting or non-inverting. The skilled person will of cause be capable of suggesting other solutions, e.g. replacing the delay with a so-called Flip-Flop—or an inverting Flip-Flop. Also other kind of averaging devices may be suggested, e.g. an averaging filter. Likewise, the skilled person will be aware that the S-D modulator may be replaced by higher order modulators.

Above, various embodiments of the invention have been described. However, the scope of the invention should not be considered to be limited by these examples, since a person skilled in the art will be able to suggest several alternative solutions that are equivalent to the described embodiments. Rather, the scope of the invention is to be defined by the appended claims.

I claim:

1. An output stage for a hearing aid, said hearing aid comprising an input transducer device, an AD-converter, a digital signal processor, a single bit Sigma-Delta modulator, an output driver and an output transducer, said output driver having an H-bridge with two branches, each branch having a respective output terminal for connection to the output transducer, a first one of the branches being controlled by a first binary control signal, and a second one of the branches being controlled by a second binary control signal, which second binary control signal is derived as a time-delayed version of the first binary control signal.

2. The output stage according to claim 1, wherein the output driver is implemented in CMOS technology.

3. The output stage according to claim 1, wherein the time-delayed version of the first binary control signal is obtained by use of a clocked delay.

4. The output stage according to claim 3, wherein the clocked delay comprises a clocked inverter.

5. The output stage according to claim 3, wherein the clocked delay comprises a clocked, inverting flip-flop.

6. The output stage according to claim 1, wherein the output driver comprises an averaging filter adapted for performing a time-averaging function.

7. A hearing aid comprising an input transducer device, an AD-converter, a digital signal processor and an output stage, said output stage comprising a single bit Sigma-Delta modulator and an output transducer, said output stage further comprising an output driver, said output driver having an H-bridge with two branches, each branch having a respective output terminal for connection to the output transducer, a first one of the branches being controlled by a first binary control signal, and a second one of the branches being controlled by a second binary control signal, which second binary control signal is derived as a time-delayed version of the first binary control signal.

8. A method of driving an output transducer in a hearing aid, comprising
producing a first binary control signal,
producing a second binary control signal in the form of a delayed version of the first binary control signal,
selecting an H-bridge having a first branch and a second branch,
connecting a respective output terminal of each of said first and said second branch with a respective terminal of the output transducer,
controlling said first branch by the first binary control signal, and
controlling said second branch by the second binary control signal.

9. The method according to claim 8, wherein the delayed version of the first binary control signal is delayed by one clock-pulse.

10. The method according to claim 8, wherein said first branch is a non-inverting branch, and wherein said second branch employs an inverter-delay combination to invert and delay said first binary control signal in order to derive said second binary control signal.

* * * * *